US012781341B2

(12) United States Patent
Yoshida

(10) Patent No.: US 12,781,341 B2
(45) Date of Patent: Nov. 3, 2026

(54) METHOD OF FORMING SiOCN LAYER

(71) Applicant: ASM IP Holding B.V., Almere (NL)

(72) Inventor: Takashi Yoshida, Machida (JP)

(73) Assignee: ASM IP Holding B.V., Almere (NL)

( * ) Notice: Subject to any disclaimer, the term of this patent is extended or adjusted under 35 U.S.C. 154(b) by 471 days.

(21) Appl. No.: 18/209,640

(22) Filed: Jun. 14, 2023

(65) Prior Publication Data

US 2023/0407465 A1 Dec. 21, 2023

Related U.S. Application Data

(60) Provisional application No. 63/353,302, filed on Jun. 17, 2022.

(51) Int. Cl.

| | |
|---|---|
| *C23C 16/36* | (2006.01) |
| *C23C 16/32* | (2006.01) |
| *C23C 16/455* | (2006.01) |
| *C23C 16/50* | (2006.01) |
| *H10P 14/60* | (2026.01) |
| *H10P 14/69* | (2026.01) |
| *H10P 14/692* | (2026.01) |

(52) U.S. Cl.
CPC ............ *C23C 16/36* (2013.01); *C23C 16/325* (2013.01); *C23C 16/45529* (2013.01); *C23C 16/45536* (2013.01); *C23C 16/50* (2013.01); *H10P 14/6336* (2026.01); *H10P 14/6339* (2026.01); *H10P 14/662* (2026.01); *H10P 14/6905* (2026.01); *H10P 14/6922* (2026.01); *H10P 14/6682* (2026.01); *H10P 14/6684* (2026.01); *H10P 14/6687* (2026.01)

(58) Field of Classification Search
None
See application file for complete search history.

(56) References Cited

U.S. PATENT DOCUMENTS

| | | | | |
|---|---|---|---|---|
| 9,455,138 B1 | 9/2016 | Fukazawa | | |
| 2017/0140925 A1 | 5/2017 | Suzuki | | |
| 2017/0323782 A1* | 11/2017 | Suzuki | ................ | C23C 16/4408 |
| 2018/0347035 A1* | 12/2018 | Weimer | .............. | H01L 21/3105 |

FOREIGN PATENT DOCUMENTS

| | | | | |
|---|---|---|---|---|
| TW | 202440986 A | * 10/2024 | ....... | H01L 21/76834 |

* cited by examiner

*Primary Examiner* — Jeffrey D Washville
(74) *Attorney, Agent, or Firm* — Snell & Wilmer L.L.P.

(57) ABSTRACT

A method of forming a silicon oxycarbonitride layer on a substrate is disclosed. An exemplary method includes forming a layer comprising SiOC and forming a layer comprising SiCN, which together form the silicon oxycarbonitride layer.

23 Claims, 10 Drawing Sheets

METHOD OF FORMING SiOCN LAYER

CROSS-REFERENCE TO RELATED APPLICATIONS

This application claims priority to U.S. Provisional Patent Application Ser. No. 63/353,302 filed Jun. 17, 2022 titled METHOD OF FORMING SiOCN LAYER, the disclosure of which is hereby incorporated by reference in its entirety.

FIELD OF INVENTION

The present disclosure generally relates to methods of forming thin films and to structures including the thin films. More particularly, the disclosure relates to methods of forming structures that include a layer comprising silicon, oxygen, carbon, and nitrogen, and to structures including such layers.

BACKGROUND OF THE DISCLOSURE

Silicon nitride- or oxide-containing films can be used for a wide variety of applications. For example, during the formation of electronic devices, such films can be used as insulating layers, as etch stop layers, and for use in the formation of spacers.

For several applications, it may be desirable for the silicon nitride- or oxide-containing material to be relatively resistant to wet etching processes, such as wet etching using hydrofluoric acid and/or hot phosphoric acid, and/or to ashing processes. In addition, it may be desirable that such material exhibits a relatively low dielectric constant.

Silicon nitride- or oxide-doped layers, such as silicon oxycarbonitride (SiOCN) layers can exhibit desired etch rate and/or ashing resistance and desired dielectric constants for many applications. For many applications, it may be desirable to deposit silicon oxycarbonitride layers on a surface of a substrate at relatively low (e.g., less than 650° C.) temperatures. Plasma-enhanced chemical vapor deposition (PECVD) can be used to deposit silicon oxycarbonitride layers on a substrate surface at relatively low temperatures.

Typical PECVD techniques to deposit silicon oxycarbonitride layers include use of a silicon precursor and a nitrogen-containing reactant. The nitrogen-containing reactant is typically used to form a plasma. Activated species from the plasma react with the silicon precursor. Although such techniques may work well for some applications, a growth rate of silicon oxycarbonitride layers using activated species formed from a nitrogen-containing reactant can be relatively low. The low growth rate may be due to nitrogen groups that form on the surface of the substrate that can inhibit growth of the silicon oxycarbonitride. Further, it can be difficult to control nitrogen content in silicon oxycarbonitride layers using nitrogen-containing reactants. Accordingly, improved methods for forming SiOCN layers are desired.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

Various embodiments of the present disclosure relate to methods of forming silicon oxycarbonitride layers. While the ways in which various embodiments of the present disclosure address drawbacks of prior methods and structures are discussed in more detail below, in general, various embodiments of the disclosure provide improved methods that form SiOCN with desired properties, such as desired etch resistance, desired dielectric constant, desired composition, and/or the like.

In accordance with at least one embodiment of the disclosure, a method of forming a silicon oxycarbonitride layer is provided. The method can include providing a substrate within a reaction chamber of a reactor, forming a layer comprising SiOC, and forming a layer comprising SiCN. The layers of SiOC and SiCN can together form the silicon oxycarbonitride layer. The step of forming the layer comprising SiOC can include providing a first silicon precursor within the reaction chamber to thereby form first silicon species on the surface of the substrate, providing a first reactant to the reaction chamber, and forming activated species from the first reactant. The step of forming the layer comprising SiCN can include providing a second silicon precursor within the reaction chamber to thereby form second silicon species on the surface of the substrate, providing a second reactant to the reaction chamber, and forming activated species from the second reactant. In accordance with aspects of these embodiments, the first silicon precursor and the second silicon precursor differ. In accordance with additional aspects, the first reactant and the second reactant do not comprise nitrogen. In accordance with further aspects, the first reactant does not include oxygen. In accordance with yet further aspects, the second reactant does not include oxygen. In accordance with further examples, the first silicon precursor includes or consists of Si, C, and O. In accordance with further examples, the second silicon precursor includes or consists of Si, C, and N or Si, C, N, and O.

In accordance with further exemplary embodiments of the disclosure, a structure includes a layer comprising SiOCN. The structures can be formed using, for example, a method as described herein.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
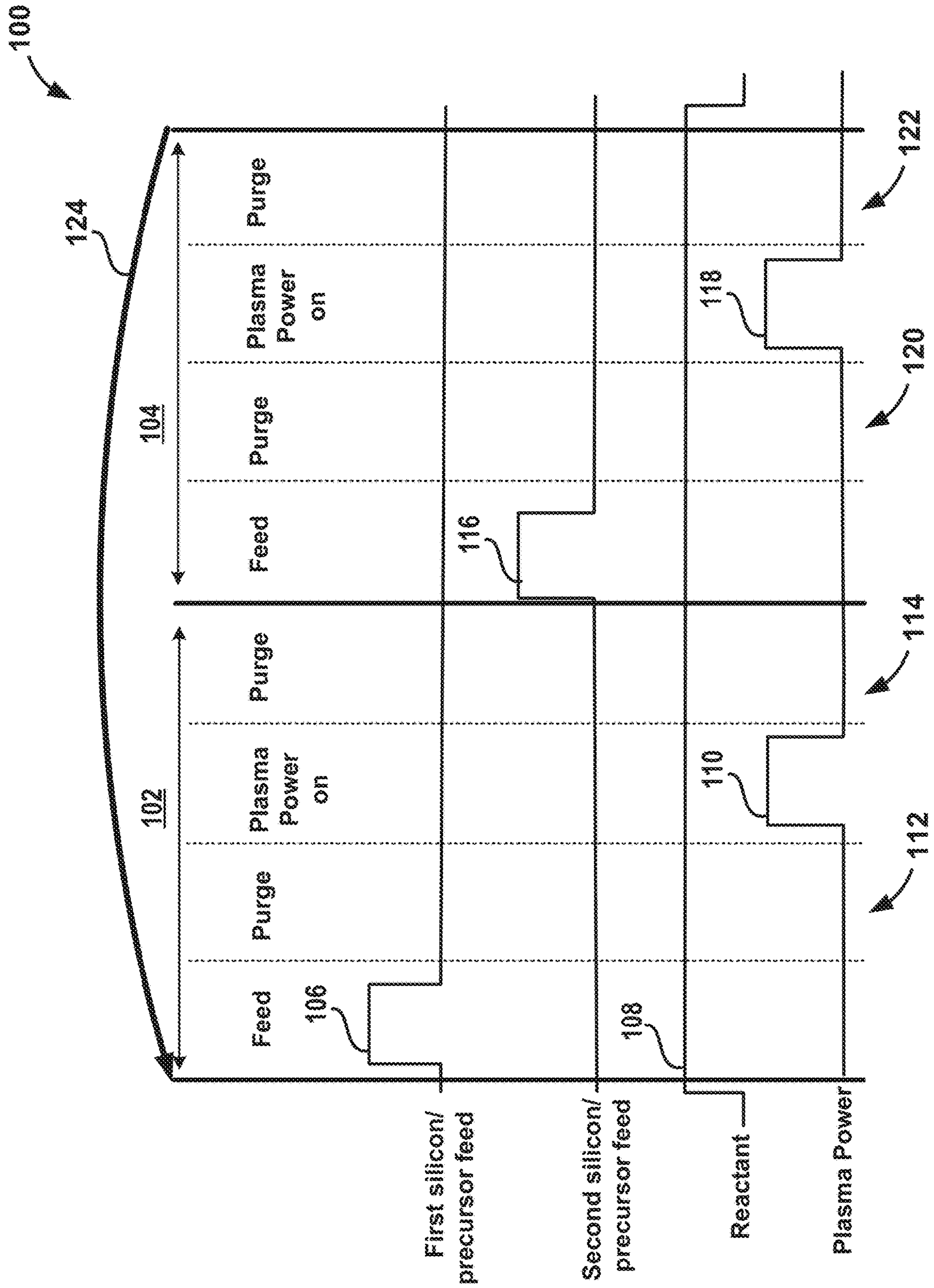
FIG. 1 illustrates a timing sequence suitable for a method of forming a silicon oxycarbonitride layer in accordance with at least one embodiment of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods of forming silicon oxycarbonitride (SiOCN) layers. As set forth in more detail below, methods described herein can be used to form silicon oxycarbonitride layers with desired properties, such as relatively high wet etch resistance, relatively low dielectric constant, relatively low leakage current for an applied field, and/or with desired compositions, such as desired carbon concentrations.

Exemplary methods described herein can be used to form structures that can be used in a variety of applications, such as the formation of electronic devices. For example, the methods can be used to form structures suitable for cell isolation in 3D cross point memory devices, self-aligned vias, dummy gates, reverse tone patterns, PC RAM isolation, cut hard masks, DRAM storage node contact (SNC) isolation, and the like.

As used herein, the term substrate can refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as Group III-V or Group II-VI semiconductors, and can include one or more layers overlying or underlying the bulk material. Further, the substrate can include various features, such as gaps (e.g., recesses or vias), lines or protrusions, such as lines having gaps formed therebetween, and the like formed on or within or on at least a portion of a layer or bulk material of the substrate. By way of examples, one or more features (e.g., recesses) can have a width of about 10 nm to about 100 nm, a depth or height of about 30 nm to about 1,000 nm, and/or an aspect ratio of about 3.0 to about 100.0.

In some embodiments, film refers to a layer extending in a direction perpendicular to a thickness direction. In some embodiments, layer refers to a material having a certain thickness formed on a surface and can be a synonym of a film or a non-film structure. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequence, and/or functions or purposes of the adjacent films or layers. The layer or film can be continuous—or not. Further, a single film or layer can be formed using multiple deposition cycles. Further, a layer, such as a silicon oxycarbonitride layer, can include two or more layers, such as a layer comprising SiOC and a layer comprising SiCN.

As used herein, the term cyclic deposition process can refer to a vapor deposition process in which deposition cycles, typically a plurality of consecutive deposition cycles, are conducted in a process chamber. Cyclic deposition processes can include cyclic chemical vapor deposition (CVD) and atomic layer deposition processes. A plasma cyclic deposition process can include one or more cycles that include plasma activation of a precursor, a reactant, and/or an inert gas. Generally, each deposition cycle of a cyclic deposition process can include one or more of (1) pulsing a precursor to the reaction chamber, (2) pulsing a reactant to the reaction chamber, or (3) pulsing a plasma power or other activation source. In some cases, the cyclic deposition process can include two or all three of such steps.

In this disclosure, continuously or continuous or continually can refer to without breaking a vacuum, without interruption as a timeline, without any material intervening step, without changing treatment conditions, immediately thereafter, as a next step, or without an intervening discrete physical or chemical structure between two structures other than the two structures in some embodiments and depending on the context.

As used herein, a layer comprising SiOC includes material with silicon, oxygen, and carbon. In some embodiments, SiOC layers may comprise one or more elements in addition to Si, and C, such as H. In some embodiments, the SiOC layers may comprise Si—C bonds and/or Si—O bonds. In some embodiments, the SiOC layers may comprise more Si—O bonds than Si—C bonds. In some embodiments, the SiOC layers may comprise from about or greater than 0% to about 60% carbon on an atomic basis. In some embodiments, the SiOC layers may comprise from about 0.1% to about 50%, from about 0.5% to about 40%, from about 1% to about 30%, or from about 5% to about 20% carbon on an atomic basis. In some embodiments, the SiOC layers may comprise from about or greater than 0% to about 70% oxygen on an atomic basis. In some embodiments, the SiOC layers may comprise from about 10% to about 70%, from about 15% to about 50%, or from about 20% to about 40% oxygen on an atomic basis. In some embodiments, the SiOC layers may comprise about or greater than 0% to about 50% silicon on an atomic basis. In some embodiments, the SiOC layers may comprise from about 10% to about 50%, from about 15% to about 40%, or from about 20% to about 35% silicon on an atomic basis. In some embodiments, the SiOC layers may comprise from about 0.1% to about 40%, from about 0.5% to about 30%, from about 1% to about 30%, or from about 5% to about 20% hydrogen on an atomic basis.

As used herein, a layer comprising SiCN includes material with silicon, carbon, and nitrogen. In some embodiments, SiCN layers may comprise one or more elements in addition to Si, C, and N, such as H and/or O. In some embodiments, the SiCN layers may comprise from about or greater than 0% to about 60% carbon on an atomic basis. In some embodiments, the SiCN layers may comprise from about 0.1% to about 50%, from about 0.5% to about 40%, from about 1% to about 30%, or from about 5% to about 20% carbon on an atomic basis. In some embodiments, the SiCN layers may comprise from about 0% to about 70% oxygen on an atomic basis. In some embodiments, the SiCN layers may comprise from about 10% to about 70%, from about 15% to about 50%, or from about 20% to about 40% oxygen on an atomic basis. In some embodiments, the SiCN layers may comprise about or greater than 0% to about 50% silicon on an atomic basis. In some embodiments, the SiCN layers may comprise from about 10% to about 50%, from about 15% to about 40%, or from about 20% to about 35% silicon on an atomic basis. In some embodiments, the SiCN layers may comprise from about 0.1% to about 40%, from about to about 30%, from about 1% to about 30%, or from about 5% to about 20% hydrogen on an atomic basis. In some other embodiments, the SiCN layers may comprise from about or greater than 0% to about 30%, from about 2% to about 25%, or from about 5% to about 20% nitrogen on an atomic basis (at %).

As used herein, unless stated otherwise, a silicon oxycarbonitride (SiOCN) layer is not intended to limit, restrict, or define the bonding or chemical state, for example, the oxidation state, of any of Si, O, C, N and/or any other element in the film. Further, in some embodiments, SiOCN layers may comprise one or more elements in addition to Si, O, C, and N, such as H. In some embodiments, the SiOCN layers may comprise Si—C bonds and/or Si—O bonds. In some embodiments, the SiOCN layers may comprise more Si—O bonds than Si—C bonds, for example, a ratio of Si—O bonds to Si—C bonds may be from about 1:1 to about 10:1. In some embodiments, the SiOCN layers may comprise from about or greater than 0% to about 60% carbon on an atomic basis. In some embodiments, the SiOCN layers may comprise from about 0.1% to about 50%, from about 0.5% to about 40%, from about 1% to about 30%, or from about 25% to about 40% carbon on an atomic basis. In some embodiments, the SiOCN layers may comprise from about or greater than 0% to about 70% oxygen on an atomic basis. In some embodiments, the SiOCN layers may comprise from about 10% to about 70%, from about 15% to about 50%, or from about 20% to about 40% oxygen on an atomic basis. In some embodiments, the SiOCN layers may comprise from about or greater than 0% to about 50% silicon on an atomic basis. In some embodiments, the SiOCN layers may comprise from about 10% to about 50%, from about 15% to about 40%, or from about 20% to about 35% silicon on an atomic basis. In some embodiments, the SiOCN layers may comprise from about 0.1% to about 40%, from about 0.5% to about 30%, from about 1% to about 30%, or from about 5% to about 20% hydrogen on an atomic basis. In some other embodiments, the SiOCN layers may comprise from about or greater than 0% to about 30%, from about 2% to about 25%, or from about 5% to about 30% nitrogen on an atomic basis (at %).

A dielectric constant of the film comprising SiOCN can range from about 3 to about or about 3.6 to about 5. A refractive index can range from, for example, about 1.4 to 2. A wet etch ratio (compared to thermal silicon oxide) can range from, for example, about 0 to about 1.5 or from about 0.05 to about 1.

In this disclosure, any two numbers of a variable can constitute a workable range of the variable, and any ranges indicated may include or exclude the endpoints. Additionally, any values of variables indicated (regardless of whether they are indicated with about or not) may refer to precise values or approximate values and include equivalents, and may refer to average, median, representative, majority, etc. in some embodiments. Further, in this disclosure, the terms including, constituted by and having can refer independently to typically or broadly comprising, comprising, consisting essentially of, or consisting of in some embodiments. In this disclosure, any defined meanings do not necessarily exclude ordinary and customary meanings in some embodiments.

Exemplary methods in accordance with the disclosure include providing a substrate within a reaction chamber of a reactor, forming a layer comprising SiOC, and forming a layer comprising SiCN. As noted above, the layer comprising SiOC and layer comprising SiCN together can form a silicon oxycarbonitride layer.

The substrate can be provided within any suitable reaction chamber of any suitable reactor. In accordance with examples of the disclosure, the reaction chamber can form part of a cyclical deposition reactor, such as an atomic layer deposition (ALD) reactor (e.g., a plasma-enhanced ALD reactor) or a (e.g., plasma-enhanced) cyclical chemical vapor deposition reactor. The reactor can be a single substrate reactor or a batch reactor. Various steps of methods described herein can be performed within a single reaction chamber or can be performed in multiple reaction chambers, such as reaction chambers of a cluster tool. Optionally, a reactor including the reaction chamber can be provided with a heater to activate the reactions by elevating the temperature of one or more of the substrate and/or the reactants and/or precursors.

Prior to the step of forming a layer comprising SiOC, the substrate can be brought to a desired temperature and pressure for forming a layer comprising SiOC. By way of examples, a temperature (e.g., of a substrate or a substrate support) within a reaction chamber can be between about 75° C. and about 500° C. or about 200° C. and about 300° C. A pressure within the reaction chamber can be between about 400 Pa and about 3000 Pa or about 500 Pa and about 1500 Pa.

The step of forming a layer comprising SiOC can include a cyclical deposition process that includes providing a first silicon precursor within the reaction chamber to thereby form first silicon species on the surface of the substrate, providing a first reactant to the reaction chamber, and forming activated species from the first reactant.

The first silicon precursor can include silicon, carbon, oxygen, and hydrogen. In some cases, the first silicon precursor comprises one, two, or three or more Si—C bonds. In some cases, the first silicon precursor comprises one, two, or three or more Si—O bonds. In some cases, the first silicon precursor comprises one, two, three, or four or more C—O bonds.

In some embodiments, a first silicon precursor includes two Si atoms connected by, or bonded to, at least one (e.g., a C1-C4) hydrocarbon group. In some embodiments, a first silicon precursor includes two Si atoms connected by, or bonded to, at least one (e.g., a C1-C4) alkyl group.

In some embodiments, the first silicon precursor may comprise at least one Si atom attached or bonded to one or more alkoxy groups.

In some embodiments, at least some Si precursors may comprise bridged alkoxysilanes having the following general formula:

$$(R^{II}O)_3Si—R^{I}—Si(OR^{II})_3 \quad (1)$$

wherein each of $R^I$ and $R^{II}$ may be independently selected alkyl groups. In some embodiments, each of $R^I$ and $R^{II}$ are independently selected C1-C5 alkyl ligands, such as methyl, ethyl, n-propyl, isopropyl, tertbutyl, or pentyl.

According to some embodiments, some first silicon precursors may comprise bridged alkoxyalkylsilanes having the following general formula:

$$R'''_y(OR'')_xSi—R'—Si(OR'')_xR'''_y \quad (2)$$

wherein each of R', R'', and R''' may be independently selected alkyl groups, and x+y=3. In some embodiments, each of R' and R'' are independently selected $C_1$-$C_5$ alkyl ligands, such as methyl, ethyl, n-propyl, isopropyl, tertbutyl, or pentyl. In some embodiments, R''' may be an independently selected C1-C8 alkyl ligand.

According to some embodiments, some first silicon precursors may comprise alkoxyalkylsilanes having the following general formula:

$$Si(OR')_{4-x}R''_x \quad (3)$$

wherein each of R' and R'' may be independently selected alkyl group, and x=1-3. In some embodiments, R' may be an independently selected C1-C5 alkyl ligand.

According to some embodiments, some first silicon precursors may have the following general formula:

$$(R^IO)_{4-x}Si—(R''—O—R''')_x \quad (4)$$

wherein x=0-3, each of R' and R'' may be an independently selected C1-C7 or C1-C5 alkyl ligand, and R''' may be an independently selected ligand consisting of carbon, and/or hydrogen, and/or oxygen.

By way of particular examples, the first silicon precursor can be selected from one or more of

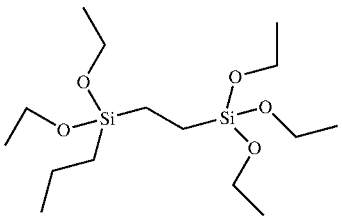

or

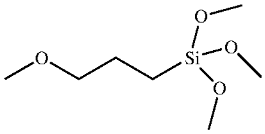

In some embodiments, the first silicon precursor does not comprise a halogen. In some embodiments, the first silicon precursor does not comprise nitrogen.

A flowrate of the first carrier gas used to provide the precursor to the reaction chamber can be between about 100 and about 5000 or between about 2000 and about 4000 sccm. A duration of the step of providing the first silicon precursor within the reaction chamber during each cycle can be between about 0.05 and about 1 or between about 0.3 and about 0.7 seconds.

In accordance with further examples, the first reactant does not include nitrogen. In accordance with further examples, the first reactant does not include oxygen. In accordance with particular examples, the first reactant includes one or more of $H_2$, Ar, or He.

Activated species can be formed using the first reactant by forming a plasma, such as a direct, indirect or remote plasma. A power used to form the plasma can be between about 50 and about 1200 or between about 100 and about 400 W. A duration of a plasma power pulse during each deposition cycle to form the a layer comprising SiOC can be between about 0.05 and about 1 or between about 0.1 and about 0.5 seconds.

A flowrate of the first reactant to the reaction chamber can be between about 10 and about 1000 or between about 20 and about 700 sccm. As discussed in more detail below, the first reactant can be continually supplied to the reaction chamber during one or more (e.g., a plurality of) steps of forming a layer comprising SiOC and/or forming a layer comprising SiCN.

The step of forming a layer comprising SiCN can include a cyclical deposition process that includes providing a second silicon precursor within the reaction chamber to thereby form second silicon species on the surface of the substrate, providing a second reactant to the reaction chamber, and forming activated species from the second reactant.

The second silicon precursor can include silicon, carbon, nitrogen, hydrogen, and, in some cases, oxygen. In accordance with examples of the disclosure, the second silicon precursor is different than the first silicon precursor. In some cases, the second silicon precursor comprises one, two, or three or more Si—C bonds. In some cases, the second silicon precursor comprises one, two, or three or more Si—O bonds. In some cases, the second silicon precursor comprises one, two, or three or more C—O bonds. In some cases, the second silicon precursor comprises one or two or more Si—N bonds. In some cases, the second silicon precursor comprises one, two, or three or more C—N bonds.

In some embodiments, the second silicon precursor includes a Si atom bonded to at least one (e.g., a C1-C4) alkyl group.

In some embodiments, the second silicon precursor may comprise at least one Si atom attached or bonded to one or more alkoxy groups.

In some cases, the second silicon precursor includes a silicon atom bonded to one or two nitrogen atoms.

In some embodiments, the second silicon precursor can be represented by a formula:

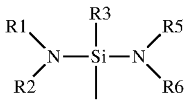

(5)

wherein each R1-R6 is independently selected from H or a C1-C4 alkyl or alkoxy group.

For example:

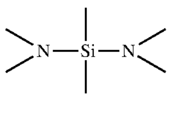

In accordance with additional examples, the second silicon precursor can be represented by a formula:

(6)

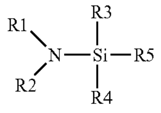

wherein each R1-R5 is independently selected from H or a C1-C4 alkyl or alkoxy group. For example:

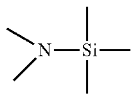

In accordance with additional examples, the second silicon precursor can be represented by a formula:

(7)

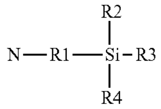

wherein R1 can be a C1-C4 alkyl chain and each R2-R4 is independently selected from a C1-C4 alkoxy group.
For example:

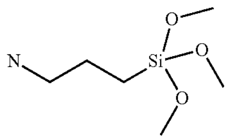

In some embodiments, the second silicon precursor does not comprise a halogen. In some embodiments, the second silicon precursor does not comprise oxygen.

A flowrate of a carrier gas used to provide the second silicon precursor to the reaction chamber can be between about 100 and about 5000 or about 2000 and about 4000 sccm. A duration of the step of providing the second silicon precursor within the reaction chamber during each cycle can be between about 0.05 and about 1 or between about 0.3 and about 0.7 seconds.

The second reactant can be the same or different from the first reactant. In accordance with examples of the disclosure, the second reactant does not include nitrogen. In accordance with further examples, the second reactant does not include oxygen. In accordance with particular examples, the second reactant includes one or more of $H_2$, Ar, or He. The flowrate of the second reactant can be the same or similar to the flowrate noted above in connection with the first reactant. Similarly, the plasma power and plasma power duration noted above can be used to form activated species from the second reactant.

A reaction chamber can be purged before or after one or more steps described above. During a purge step, excess reactant(s) and reaction byproducts, if any, may be evacuated from the reaction chamber, for example, by a purging gas pulse and/or vacuum generated by a pumping system. Purging gas is preferably any inert gas, such as, without limitation, argon (Ar), nitrogen ($N_2$) or helium (He).

FIG. 1 illustrates a timing sequence 100 suitable for use with the method described above. Timing sequence 100 includes a SiCO deposition cycle 102 and a SiCN deposition cycle 104.

As illustrated, SiCO deposition cycle 102 includes providing a first silicon precursor to a reaction chamber for a first silicon precursor pulse 106, continuously providing a first reactant during continuous period 108, and providing plasma power for a first plasma power pulse period 110. In the illustrated example, the timing sequence includes purge periods 112, 114, during which a precursor or byproducts can be removed from the reaction chamber. The first silicon precursor, the first reactant, the respective flowrates, temperature, pressure, the plasma power, and the like can be as described above.

SiCN deposition cycle 104 includes providing a second silicon precursor to a reaction chamber for a second silicon precursor pulse 116, continuously providing a second reactant during continuous period 108, and providing plasma power for a second plasma power pulse period 118. In the illustrated example, the timing sequence includes purge periods 120, 122, which can be the same or similar to purge periods 112, 114. The second silicon precursor, the second reactant, the respective flowrates, temperature, pressure, the plasma power, and the like can be as described above in connection with forming a layer comprising SiCN.

In accordance with examples of the disclosure, SiCO deposition cycle 102 can be repeated a number of times (e.g., 0 to 100) prior to proceeding to SiCN deposition cycle 104. SiCN deposition cycle 104 can independently be repeated a number of times (e.g., 0 to 100) prior to sequence 100 repeating. A number of times each SiCO deposition cycle 102 and/or SiCN deposition cycle 104 is repeated within a cycle 124 can vary to tune desired properties of the silicon oxycarbonitride layer. For example, a ratio of the number of SiCO deposition cycles 102 to a number of SiCN deposition cycles 104 can be used to control an amount of nitrogen and/or carbon in the SiOCN film, which can affect film properties, such as dielectric constant, wet etch rates, ashing resistivity, and the like.

In some embodiments, deposition parameters, such as the first and/or second precursor flow rate, first and/or second precursor duration, purge time, and/or reactants may be varied in one or more deposition cycles during a method in order to obtain a film with the desired characteristics.

Figure 2:
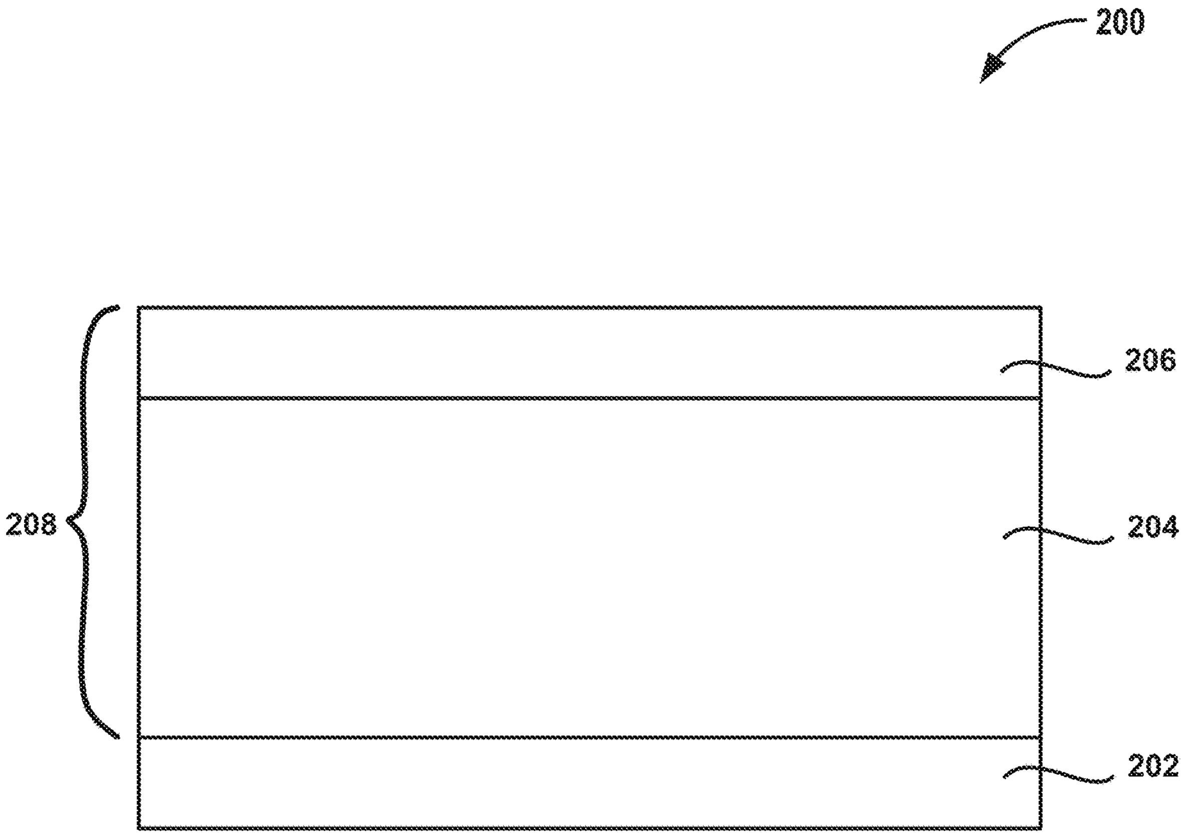
FIGS. 2-4 illustrate structures in accordance with examples of the disclosure.
Figure 3:
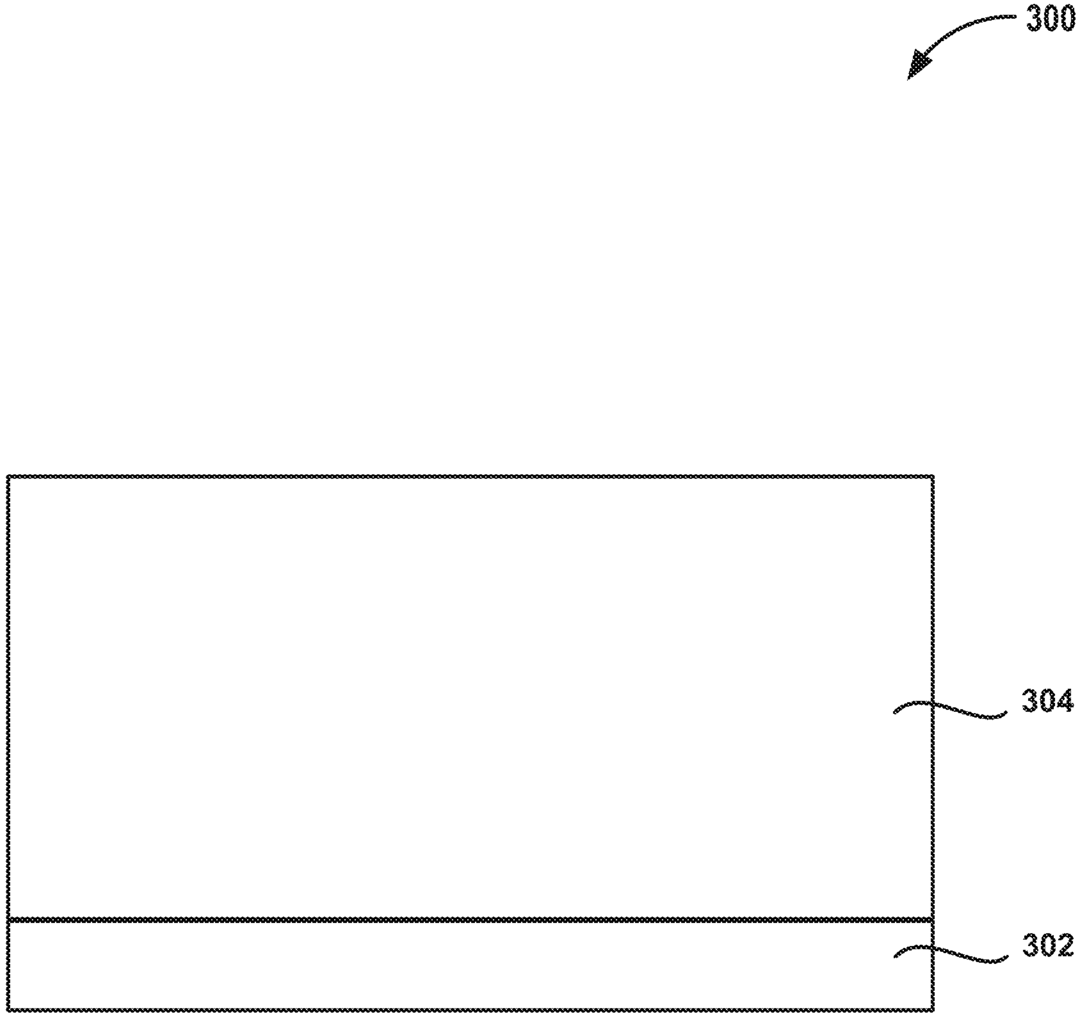
Figure 4:
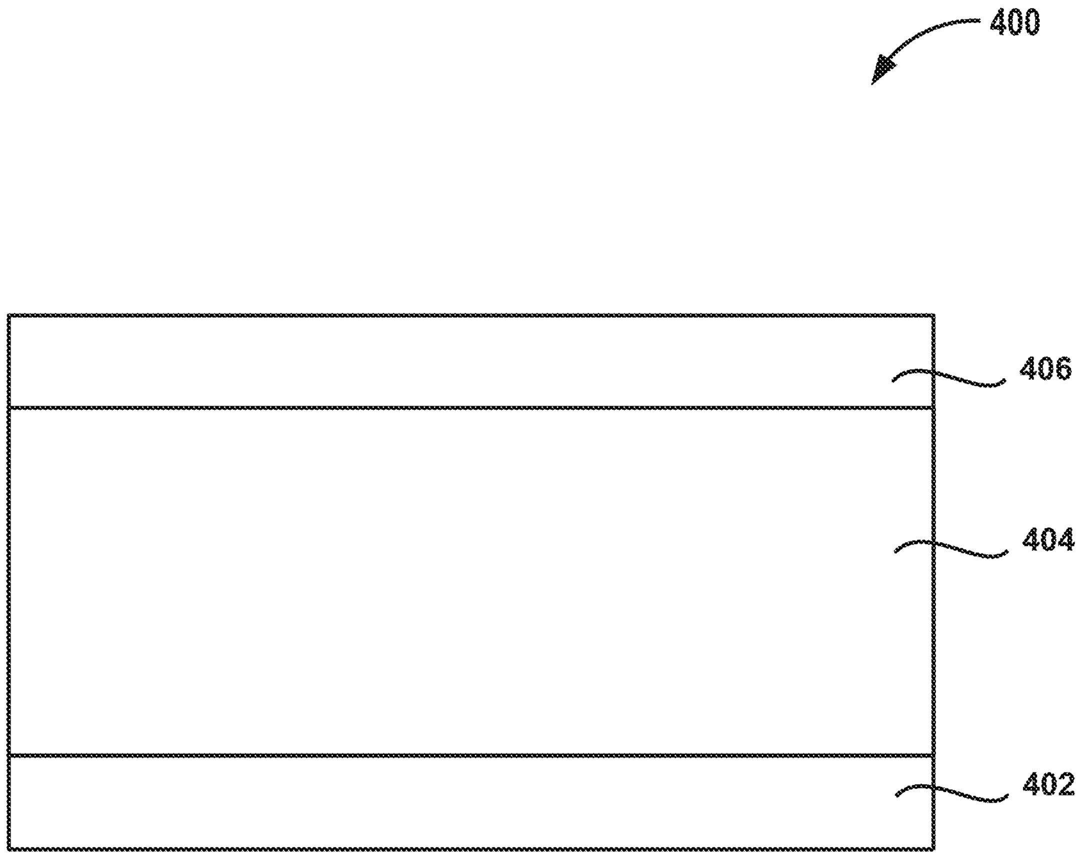

FIGS. 2-4 illustrate structures 200, 300, and 400 in accordance with examples of the disclosure. Structure 200 includes a substrate 202, a layer comprising SiOC 204, and a layer comprising SiCN 206. In some cases, the layer comprising SiCN includes oxygen. Structure 200 can be formed by, for example, repeating SiCO deposition cycle 102 and then performing SiCN deposition cycle 104 one or more times. In accordance with examples of the disclosure, a thickness of the layer comprising SiOC 204 can be between about 1 and about 25 nm. A thickness of the layer comprising SiCN 206 can be between about 1 and about 25 nm. Layer comprising SiOC 204 and layer comprising SiCN 206 together can form a silicon oxycarbonitride layer 208.

Structure 300 includes a substrate 302 and a silicon oxycarbonitride layer 304. Silicon oxycarbonitride layer 304 can be formed by forming alternating layers of SiOC and SiCN as described herein. A thickness of silicon oxycarbonitride layer 304 can be between about 1 and about 50 nm.

Structure 400 includes a substrate 402, a silicon oxycarbonitride layer 404, and a layer 406 overlying silicon oxycarbonitride layer 404. Silicon oxycarbonitride layer 404 can be as described above in connection with FIG. 2 and FIG. 3. Layer 406 can be or include a layer comprising SiOC and/or a layer comprising SiCN as described herein. A thickness of layer 406 can range from about 0.1 to about 10 nm.

Figure 5:
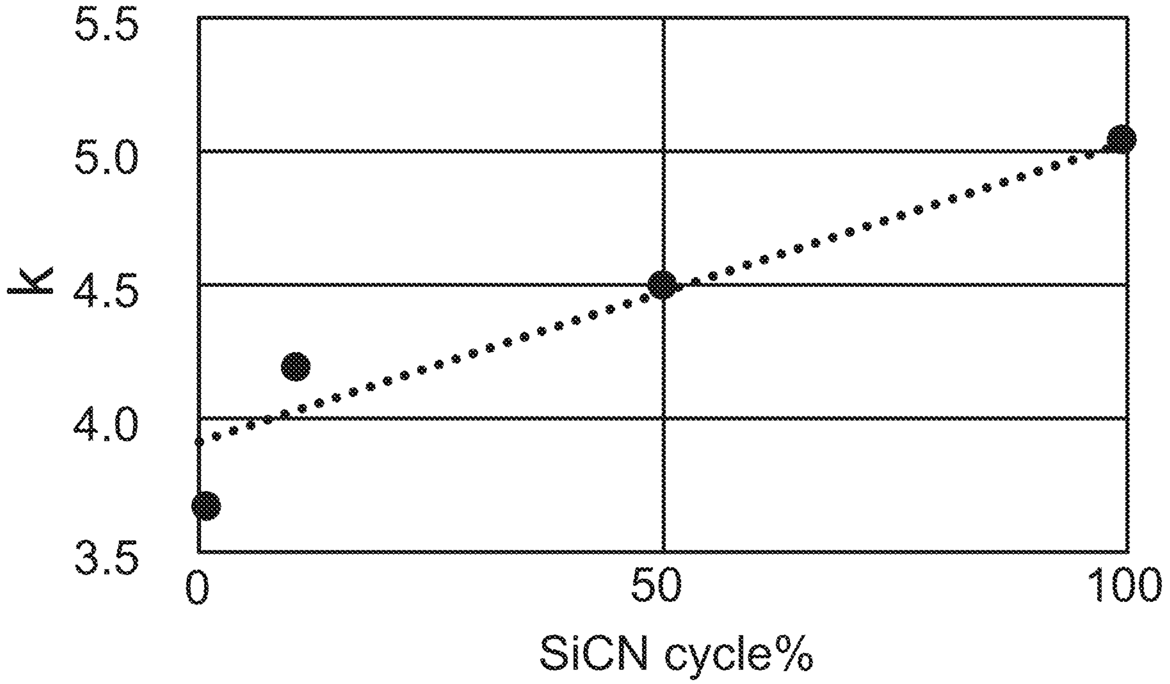
FIG. 5 illustrates dielectric constant values (k) as a function of cycles of forming a layer comprising SiCN.

FIG. 5 illustrates dielectric constant (k) as a function of a number of SiCN deposition cycles relative to a number of SiCN and SiOC deposition cycles. As illustrated, the dielectric constant generally increases as a percentage of the SiCN deposition cycles increases.

Figure 6:
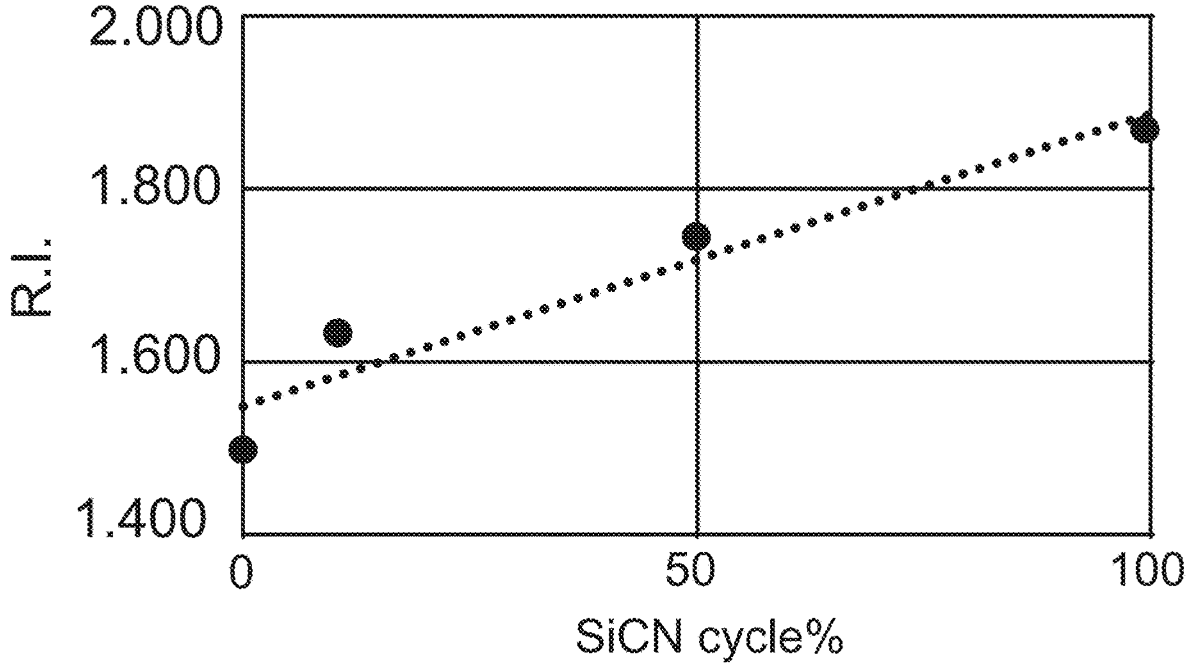
FIG. 6 illustrates refractive index values (R.I.) as a function of cycles of forming a layer comprising SiCN.

FIG. 6 illustrates refractive index (R.I.) as a function of a number of SiCN deposition cycles relative to a number of SiCN and SiOC deposition cycles. As illustrated, the refractive index generally increases as a percentage of the SiCN cycles increases.

Figure 7:
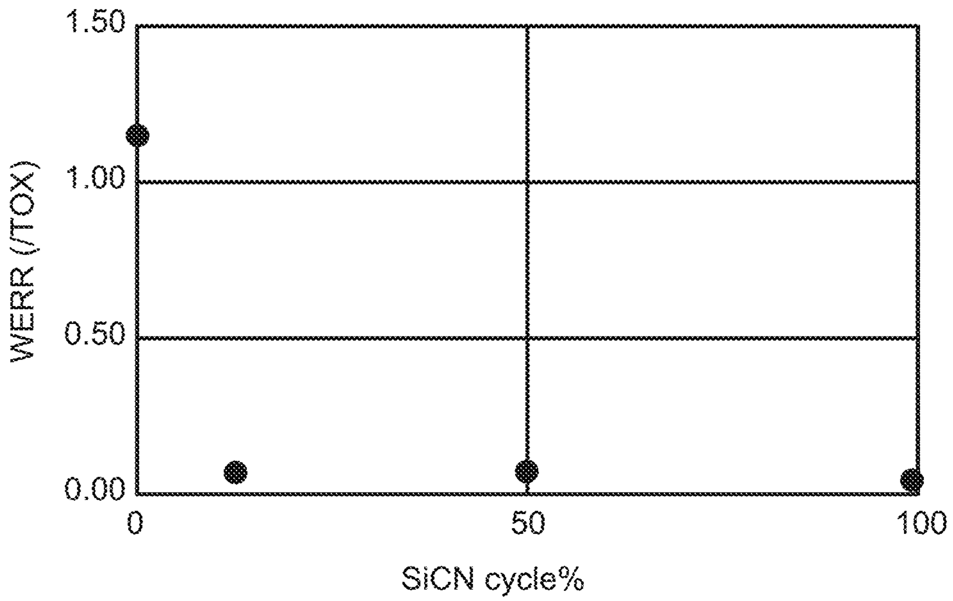
FIG. 7 illustrates wet etch rate ratios (relative to thermal silicon oxide) (WERR) as a function of cycles of forming a layer comprising SiCN.

FIG. 7 illustrates refractive wet etch rate ratio (WERR) of silicon oxycarbonitride layer formed in accordance with a method described herein compared to a wet etch rate of a thermal silicon oxide film in the same etchant (WERR) as a function of a number of SiCN deposition cycles relative to a number of SiCN and SiOC deposition cycles. As illustrated, the WERR dramatically decreases at about 10% SiCN deposition cycles and thereafter remains relatively low.

Figure 8:
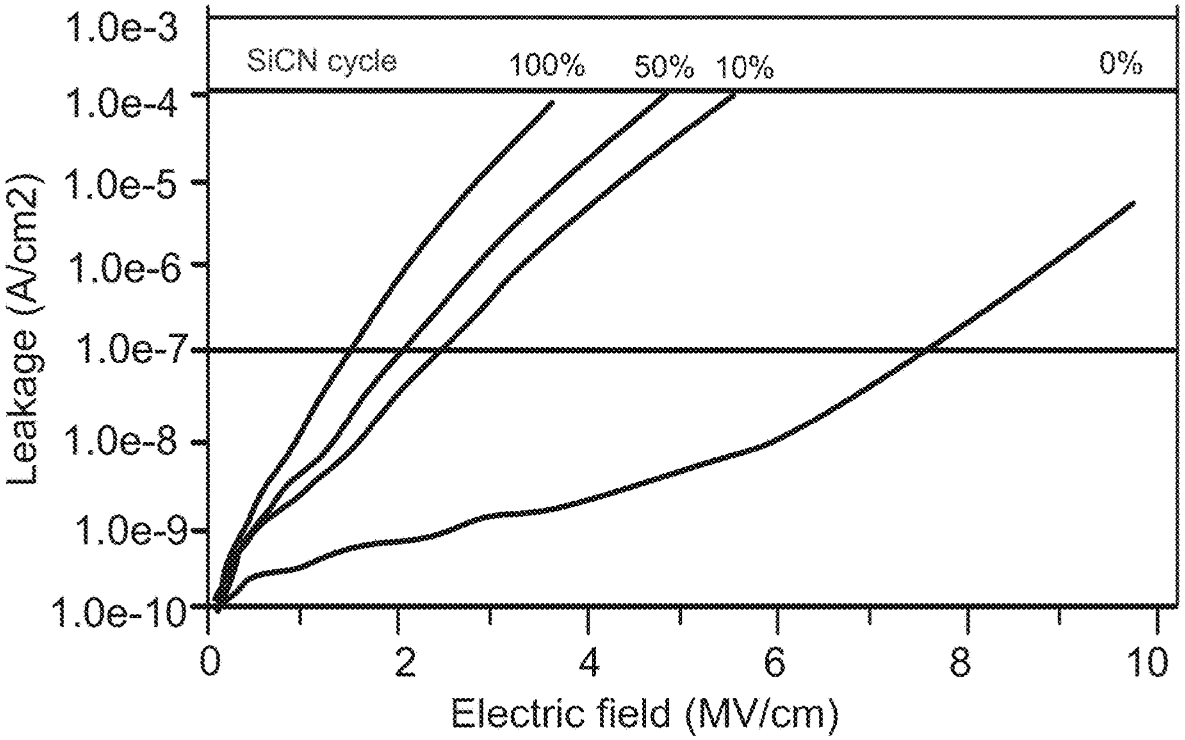
FIG. 8 illustrates leakage current as a function of electric field for silicon oxycarbonitride layers formed in accordance with exemplary embodiments of the disclosure.

FIG. 8 illustrates a non-linear relationship of the leakage current as a function of electric field for silicon oxycarbonitride layers formed in accordance with examples described herein. As illustrated, for a given electric field, a leakage current generally increases as a cycle percentage of SiCN deposition cycles increases.

Figure 9:
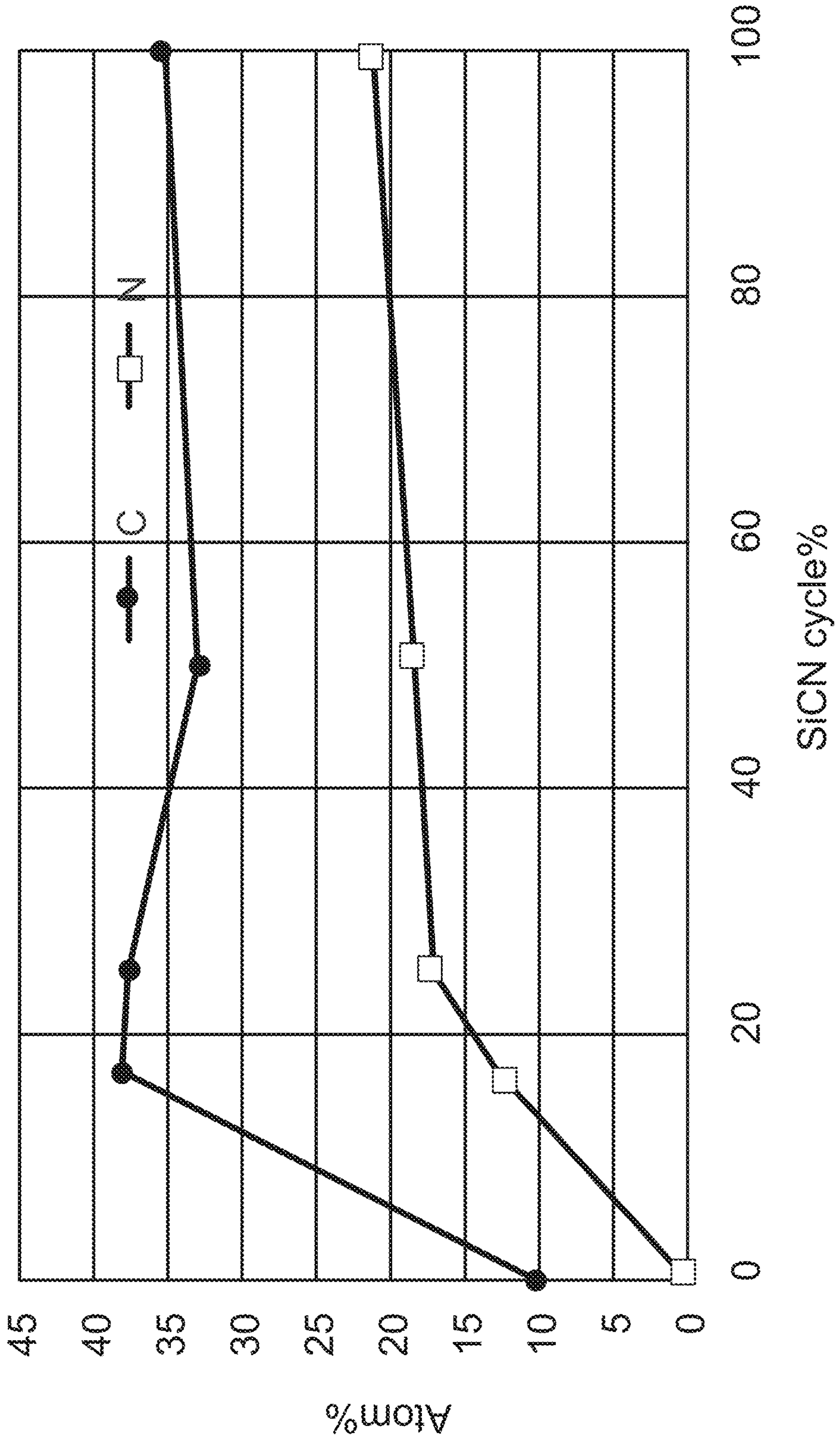
FIG. 9 illustrates carbon and nitrogen concentrations in silicon oxycarbonitride layers formed in accordance with exemplary embodiments of the disclosure.

FIG. 9 illustrates exemplary carbon and nitrogen compositions in a silicon oxycarbonitride layer formed in accordance with examples of the disclosure. In the illustrated example, the nitrogen concentration generally increases with the SiCN deposition cycle percentage.

Figure 10:
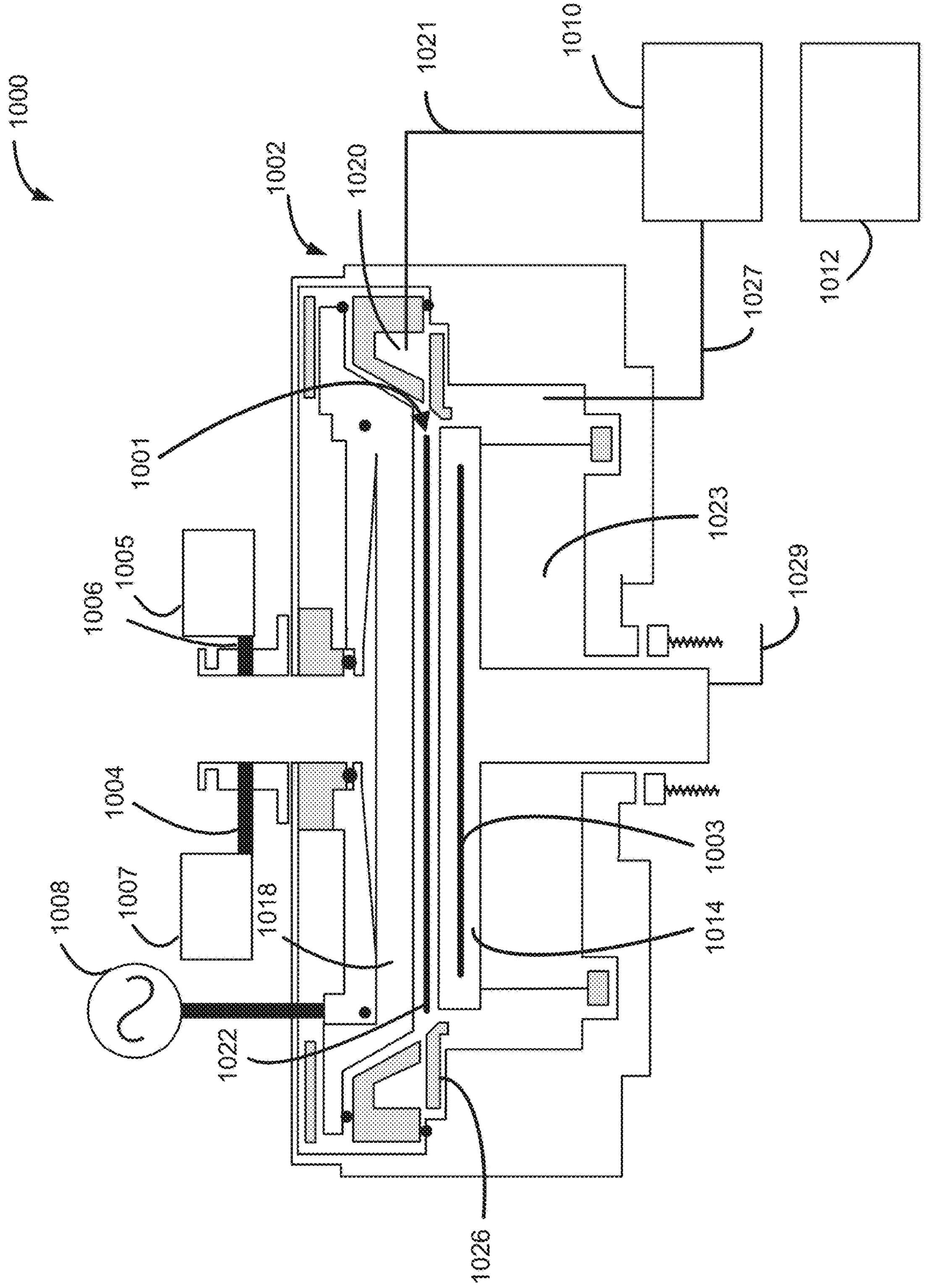
FIG. 10 illustrates a system suitable for use in accordance with at least one embodiment of the disclosure.

Turning now to FIG. 10, a reactor system 1000 in accordance with exemplary embodiments of the disclosure is illustrated. Reactor system 1000 can be used to perform one or more steps or sub steps as described herein and/or to form one or more structures or portions thereof as described herein. Reactor system 1000 is illustrated as a capacitively coupled plasma (CCP) apparatus. In accordance with alternative examples of the disclosure, the plasma power provided during one or more steps can be formed using a surface wave plasma (SWP) apparatus, an inductively coupled plasma (ICP) apparatus, or an electron cyclotron resonance (ECR) apparatus.

Reactor system 1000 includes a pair of electrically conductive flat-plate electrodes 1014, 1018, typically in parallel and facing each other in an interior 1001 (reaction zone) of a reaction chamber 1002. Although illustrated with one reaction chamber 1002, reactor system 1000 can include two or more reaction chambers. A plasma can be excited within interior 1001 by applying, for example, RF power from plasma power source(s) 1008 to one electrode (e.g., electrode 1018) and electrically grounding the other electrode (e.g., electrode 1014). A temperature regulator 1003 (e.g., to provide heat and/or cooling) can be provided in a lower stage 1014 (the lower electrode), and a temperature of a substrate 1022 placed thereon can be kept at a desired temperature, such as the temperatures noted above. Electrode 1018 can serve as a gas distribution device, such as a shower plate or showerhead. Precursor gases, reactant gases, and a carrier or inert gas, if any, or the like can be introduced into reaction chamber 1002 using one or more gas lines (e.g., reactant gas line 1004 and precursor gas line 1006, respectively, coupled to a reactant source 1007 and a precursor (e.g., first and/or second silicon) source 1005). For example, an inert gas and a reactant (e.g., as described above) can be introduced into reaction chamber 1002 using line 1004 and/or a precursor and a carrier gas (e.g., as described above) can be introduced into the reaction chamber using line 1006. Although illustrated with two inlet gas lines 1004, 1006, reactor system 1000 can include any suitable number of gas lines.

In reaction chamber 1002, a circular duct 1020 with an exhaust line 1021 can be provided, through which gas in the interior 1001 of the reaction chamber 1002 can be exhausted to an exhaust source 1010. Additionally, a transfer chamber 1023 can be provided with a seal gas line 1029 to introduce seal gas into the interior 1001 of reaction chamber 1002 via the interior (transfer zone) of transfer chamber 1023, wherein a separation plate 1026 for separating the reaction zone and the transfer chamber 1023 can be provided (a gate valve through which a substrate is transferred into or from transfer chamber 1023 is omitted from this figure). Transfer chamber 1023 can also be provided with an exhaust line 1027 coupled to an exhaust source 1010. In some embodiments, continuous flow of a carrier gas to reaction chamber 1002 can be accomplished using a flow-pass system (FPS).

Reactor system 1000 can include one or more controller(s) 1012 programmed or otherwise configured to cause one or more method steps as described herein to be conducted. Controller(s) 1012 are coupled with the various power sources, heating systems, pumps, robotics and gas flow controllers, or valves of the reactor, as will be appreciated by the skilled artisan. By way of example, controller 1012 can be configured to control gas flow of a precursor, a reactant, and/or an inert gas into at least one of the one or more reaction chambers to form a silicon oxycarbonitride layer as described herein. Controller 1012 can be further configured to provide power to form a plasma—e.g., within reaction chamber 1002. Controller 1012 can be similarly configured to perform additional steps as described herein.

Controller 1012 can include electronic circuitry and software to selectively operate valves, manifolds, heaters, pumps and other components included in system 1000. Such circuitry and components operate to introduce precursors, reactants, and purge gases from the respective sources. Controller 1012 can control timing of gas pulse sequences, temperature of the substrate and/or reaction chamber, pressure within the reaction chamber, plasma power, and various other operations to provide proper operation of the system 1000, such as in the performance of timing sequence 200 or 300.

Controller 1012 can include control software to electrically or pneumatically control valves to control flow of precursors, reactants, and/or purge gases into and out of the reaction chamber 1002. Controller 1012 can include modules, such as a software or hardware component, e.g., a FPGA or ASIC, which performs certain tasks. A module can advantageously be configured to reside on the addressable storage medium of the control system and be configured to execute one or more processes.

In some embodiments, a dual chamber reactor (two sections or compartments for processing substrates disposed close to each other) can be used, wherein a reactant gas and a noble gas can be supplied through a shared line, whereas a precursor gas is supplied through unshared lines.

During operation of system 1000, substrates, such as semiconductor wafers, are transferred from, e.g., a substrate handling area 1023 to interior 1001. Once substrate(s) are transferred to interior 1001, one or more gases, such as precursors, reactants, carrier gases, and/or purge gases, are introduced into reaction chamber 1002.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method of forming a silicon oxycarbonitride layer, the method comprising:

providing a substrate within a reaction chamber of a reactor;

forming a layer comprising SiOC, the step of forming the layer comprising SiOC comprising:

providing a first silicon precursor within the reaction chamber to thereby form first silicon species on the surface of the substrate;

providing a first reactant to the reaction chamber; and forming activated species from the first reactant;

after forming the layer comprising SiOC, forming a layer comprising SiCN, the step of forming the layer comprising SiCN comprising:

providing a second silicon precursor within the reaction chamber to thereby form second silicon species on the surface of the substrate;

providing a second reactant to the reaction chamber; and forming activated species from the second reactant, wherein the first silicon precursor and the second silicon precursor differ, and wherein the first reactant and the second reactant do not comprise nitrogen.

2. The method of claim 1, wherein the first reactant does not comprise oxygen.

3. The method of claim 1, wherein the second reactant does not comprise oxygen.

4. The method of claim 1, wherein the first reactant and the second reactant comprise the same reactant.

5. The method of claim 1, wherein one or more of the first reactant and the second reactant comprise one or more of $H_2$, Ar, or He.

6. The method of claim 1, wherein the first silicon precursor comprises one or more Si—C bonds.

7. The method of claim 1, wherein the first silicon precursor comprises three or more Si—O bonds.

8. The method of claim 1, wherein the first silicon precursor comprises one or more C—O bonds.

9. The method of claim 1, wherein the first silicon precursor comprises four or more C—O bonds.

10. The method of claim 1, wherein the first silicon precursor comprises one or more of:

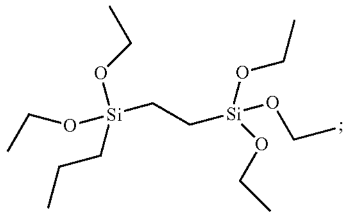

; or

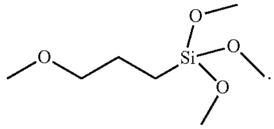

.

11. The method of claim 1, wherein the second silicon precursor comprises one or more Si—N bonds.

12. The method of claim 1, wherein the second silicon precursor comprises one or more Si—O bonds.

13. The method of claim 1, wherein the second silicon precursor comprises one or more Si—C bonds.

14. The method of claim 1, wherein the second silicon precursor comprises one or more C—N bonds.

15. The method of claim 1, wherein the second silicon precursor comprises one or more of:

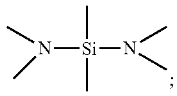

;

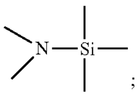

; or

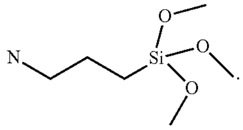

.

16. The method of claim 1, wherein the first reactant is continually flowed during the steps of forming the layer comprising SiOC and forming the layer comprising SiCN.

17. The method of claim 1, wherein the first reactant is continually flowed during a plurality of steps of forming the layer comprising SiOC and forming the layer comprising SiCN.

18. The method of claim 1, wherein the layer comprising SiCN comprises SiCNO.

19. A structure comprising:

a substrate; and a silicon oxycarbonitride layer formed according to a method of claim 1.

20. The method of claim 1, wherein the forming a layer comprising SiOC comprises a cyclical process and the providing a first silicon precursor and the forming activated species from the first reactant are repeated prior to proceeding to the forming a layer comprising SiCN.

21. The method of claim 20, wherein the forming a layer comprising SiOC and the forming a layer comprising SiCN are repeated.

22. The structure according to claim 19, further comprising a layer comprising SiOC.

23. The structure according to claim 19, further comprising a layer comprising SiCN.

* * * * *